United States Patent
Kim et al.

(10) Patent No.: US 8,347,813 B2
(45) Date of Patent: Jan. 8, 2013

(54) THIN FILM DEPOSITION APPARATUS AND METHOD THEREOF

(75) Inventors: Ki Jong Kim, Daejeon-si (KR); Dae Youn Kim, Daejeon-si (KR)

(73) Assignee: ASM Genitech Korea Ltd., Cheonan-si, Chungcheongnam-do (KR)

(*) Notice: Subject to any disclaimer, the term of this patent is extended or adjusted under 35 U.S.C. 154(b) by 932 days.

(21) Appl. No.: 12/332,234

(22) Filed: Dec. 10, 2008

(65) Prior Publication Data

US 2009/0155452 A1   Jun. 18, 2009

(30) Foreign Application Priority Data

Dec. 13, 2007  (KR) .................. 10-2007-0130392

(51) Int. Cl.
  *B05C 11/00*   (2006.01)
  *B05C 13/00*   (2006.01)
  *C23C 14/00*   (2006.01)

(52) U.S. Cl. .......... 118/712; 118/713; 118/669; 118/50; 118/500

(58) Field of Classification Search ............. 118/712, 118/713, 669, 50, 52, 612, 715–733, 500; 427/8, 9
  See application file for complete search history.

(56) References Cited

U.S. PATENT DOCUMENTS

| | | |
|---|---|---|
| 3,308,709 A | 3/1967 | Harrick |
| 3,822,946 A | 7/1974 | Rynkowski |
| 3,907,439 A | 9/1975 | Zanoni |
| 3,945,505 A | 3/1976 | Frisbie et al. |
| 4,024,944 A | 5/1977 | Adams et al. |
| 4,107,539 A | 8/1978 | Kirsch |
| 4,148,344 A | 4/1979 | Critchell et al. |
| 4,201,378 A | 5/1980 | Hams |
| 4,228,886 A | 10/1980 | Moran |
| 4,449,885 A | 5/1984 | Hertel et al. |
| 4,457,664 A | 7/1984 | Judell et al. |
| 4,466,073 A | 8/1984 | Boyan et al. |

(Continued)

FOREIGN PATENT DOCUMENTS

EP   0 282 233 A1   9/1988

(Continued)

OTHER PUBLICATIONS

ASM Europe, (Advance 400 Course Module 19), Rev. C, Jun. 1999.

(Continued)

*Primary Examiner* — Yewebdar Tadesse
(74) *Attorney, Agent, or Firm* — Knobbe, Martens, Olson & Bear LLP (57) ABSTRACT

A thin film deposition apparatus including a substrate mounting error detector, a chamber and a substrate support positioned in the chamber. The substrate support is configured to support a substrate. The substrate mounting error detector includes: a light source configured to provide a light beam to the substrate, such that the substrate reflects the light beam; a collimator configured to selectively pass at least a portion of the light beam reflected by the substrate; and an optical sensor configured to detect the at least a portion of the reflected light beam passed by the collimator. The detector is positioned and oriented to detect substrate position on a lowered support prior to raising the support into contact with an upper cover of a clamshell reactor arrangement. This configuration allows a thin film deposition process only if the substrate is correctly mounted on the substrate support. Thus, abnormal deposition due to a substrate mounting error is prevented in advance.

16 Claims, 7 Drawing Sheets

U.S. PATENT DOCUMENTS

| | | | |
|---|---|---|---|
| 4,507,078 | A | 3/1985 | Tam et al. |
| 4,523,985 | A | 6/1985 | Dimock |
| 4,545,106 | A | 10/1985 | Juengel |
| 4,559,451 | A | 12/1985 | Curl |
| 4,618,292 | A | 10/1986 | Judge et al. |
| 4,635,373 | A | 1/1987 | Miyazaki et al. |
| 4,647,268 | A | 3/1987 | Scholl |
| 4,697,089 | A | 9/1987 | Drage |
| 4,698,511 | A | 10/1987 | Sueda et al. |
| 4,698,775 | A | 10/1987 | Koch et al. |
| 4,705,951 | A | 11/1987 | Layman et al. |
| 4,720,635 | A | 1/1988 | Uga |
| 4,730,882 | A | 3/1988 | Messerschmidt |
| 4,743,769 | A | 5/1988 | Schwaiger |
| 4,744,713 | A | 5/1988 | Hrovath |
| 4,765,793 | A | 8/1988 | Goddeau |
| 4,770,590 | A | 9/1988 | Hugues et al. |
| 4,789,294 | A | 12/1988 | Sato et al. |
| 4,818,169 | A | 4/1989 | Schram et al. |
| 4,819,167 | A | 4/1989 | Cheng et al. |
| 4,833,790 | A | 5/1989 | Spencer et al. |
| 4,836,733 | A | 6/1989 | Hertel et al. |
| 4,838,733 | A | 6/1989 | Katz |
| 4,880,348 | A | 11/1989 | Baker et al. |
| 4,907,035 | A | 3/1990 | Galburt et al. |
| 4,951,601 | A | 8/1990 | Maydan et al. |
| 5,044,752 | A | 9/1991 | Thurfjell et al. |
| 5,162,642 | A | 11/1992 | Akamatsu et al. |
| 5,194,743 | A | 3/1993 | Aoyama et al. |
| 5,239,182 | A | 8/1993 | Tateyama et al. |
| 5,264,918 | A | 11/1993 | Kagami |
| 5,483,138 | A | 1/1996 | Shmookler et al. |
| 5,555,051 | A | 9/1996 | Maruyama et al. |
| 5,563,798 | A | 10/1996 | Berken et al. |
| 5,631,171 | A | 5/1997 | Sandstrom et al. |
| 5,651,086 | A | 7/1997 | Russell et al. |
| 5,706,201 | A | 1/1998 | Andrews |
| 5,706,930 | A | 1/1998 | Sahoda et al. |
| 5,710,069 | A | 1/1998 | Farkas et al. |
| 5,721,607 | A | 2/1998 | Ota |
| 5,729,337 | A | 3/1998 | Tanaka |
| 5,740,062 | A | 4/1998 | Berken et al. |
| 5,768,125 | A | 6/1998 | Zinger et al. |
| 5,783,834 | A | 7/1998 | Shatas |
| 5,812,714 | A | 9/1998 | Hulse |
| 5,822,213 | A | 10/1998 | Huynh |
| 5,841,540 | A | 11/1998 | Mondie |
| 5,844,683 | A | 12/1998 | Pavloski et al. |
| 5,870,488 | A | 2/1999 | Rush et al. |
| 5,870,498 | A | 2/1999 | Mayer |
| 5,885,353 | A | 3/1999 | Strodtbeck et al. |
| 5,900,737 | A | 5/1999 | Graham et al. |
| 5,905,850 | A | 5/1999 | Kaveh |
| 5,906,860 | A * | 5/1999 | Motoda et al. ............... 427/240 |
| 5,917,601 | A | 6/1999 | Shimazaki et al. |
| 5,923,694 | A | 7/1999 | Culver |
| 5,961,169 | A | 10/1999 | Kalenian et al. |
| 5,969,639 | A | 10/1999 | Lauf et al. |
| 5,980,194 | A | 11/1999 | Freerks et al. |
| 5,995,234 | A | 11/1999 | Nishi |
| 6,026,561 | A | 2/2000 | Lafond |
| 6,051,074 | A | 4/2000 | Strodtbeck et al. |
| 6,075,606 | A | 6/2000 | Doan |
| 6,082,950 | A | 7/2000 | Altwood et al. |
| 6,086,064 | A | 7/2000 | Biegelsen et al. |
| 6,090,209 | A | 7/2000 | Strodtbeck et al. |
| 6,099,596 | A | 8/2000 | Li et al. |
| 6,108,092 | A | 8/2000 | Sandhu |
| 6,113,165 | A | 9/2000 | Wen et al. |
| 6,131,589 | A | 10/2000 | Vogtmann et al. |
| 6,162,008 | A | 12/2000 | Perkins et al. |
| 6,167,322 | A | 12/2000 | Holbrooks |
| 6,172,756 | B1 | 1/2001 | Chalmers et al. |
| 6,197,117 | B1 | 3/2001 | Li et al. |
| 6,198,976 | B1 | 3/2001 | Sundar et al. |
| 6,220,945 | B1 | 4/2001 | Hirokawa et al. |
| 6,242,718 | B1 | 6/2001 | Ferro et al. |
| 6,267,642 | B1 | 7/2001 | Vogtmann et al. |
| 6,280,291 | B1 | 8/2001 | Gromko et al. |
| 6,293,749 | B1 | 9/2001 | Raaijmakers et al. |
| 6,305,898 | B1 | 10/2001 | Yamagishi et al. |
| 6,322,116 | B1 | 11/2001 | Stevens |
| 6,327,517 | B1 | 12/2001 | Sundar |
| 6,331,023 | B1 | 12/2001 | Goodwin et al. |
| 6,332,116 | B1 | 12/2001 | Qian et al. |
| 6,438,449 | B2 | 8/2002 | Kawamatsu et al. |
| 6,502,054 | B1 | 12/2002 | Mooring et al. |
| 6,615,113 | B2 | 9/2003 | Kretz et al. |
| 6,624,898 | B1 | 9/2003 | Chen |
| 6,665,583 | B2 | 12/2003 | Kretz et al. |
| 6,683,654 | B1 | 1/2004 | Haijima |
| 6,690,986 | B1 | 2/2004 | Mitchell et al. |
| 6,728,596 | B1 | 4/2004 | Lindseth |
| 6,771,374 | B1 | 8/2004 | Rangarajan et al. |
| 6,788,891 | B1 | 9/2004 | Mitsugi |
| 6,823,753 | B1 | 11/2004 | Beginski |
| 6,849,151 | B2 * | 2/2005 | Barnes et al. ............ 156/345.24 |
| 6,900,877 | B2 | 5/2005 | Raaijmakers |
| 6,950,774 | B2 | 9/2005 | Donald |
| 6,961,639 | B2 | 11/2005 | Gaudon et al. |
| 7,008,802 | B2 | 3/2006 | Lu |
| 2002/0052052 | A1 | 5/2002 | Robinson et al. |
| 2004/0255853 | A1* | 12/2004 | Ma et al. ....................... 118/712 |
| 2006/0130750 | A1* | 6/2006 | Ishikawa et al. ............. 118/300 |
| 2007/0037300 | A1* | 2/2007 | Qin et al. ........................ 438/14 |
| 2007/0242281 | A1 | 10/2007 | Beginski et al. |
| 2009/0093906 | A1 | 4/2009 | Takizawa et al. |
| 2009/0252580 | A1 | 10/2009 | Takizawa et al. |

FOREIGN PATENT DOCUMENTS

| | | |
|---|---|---|
| EP | 0 313 466 A2 | 4/1989 |
| EP | 0 597 637 A1 | 5/1994 |
| JP | 58-055270 | 4/1983 |
| JP | 60-024518 | 2/1985 |
| JP | 61-087352 | 5/1986 |
| JP | 361125038 | 6/1986 |
| JP | 61-184842 | 8/1986 |
| JP | 61-228639 | 10/1986 |
| JP | 62-073643 | 4/1987 |
| JP | 403012946 | 1/1991 |
| JP | 11-347975 | 12/1999 |
| JP | 2005-093807 | 4/2005 |
| WO | WO 99/52686 | 10/1999 |
| WO | WO 00/42638 | 7/2000 |
| WO | WO 00/68977 | 11/2000 |

OTHER PUBLICATIONS

Brooks Automation, (Wafer Handling Robot), Solid State Technology, vol. 28, No. 1, Jan. 1985, p. 74.

DeGuchi et al., "Alignment accuracy evaluation of x-ray lithography system SR-1," Journal of the Japan Society of Precision Engineering, 1985, vol. 51, No. 5, pp. 156-162.

GCA Corporation, (Wafertrac1006 Advertisement), Solid State Technology, vol. 28, No. 1, Jan. 1985, p. 3.

IBM Technical Disclosure Bulletin, "Automatic mask/wafer alignment system," Sep. 1985, vol. 28, No. 4, pp. 1474-1479.

IBM Technical Disclosure Bulletin, "Front wafer registration device for batch process etch end-pint detection system," Oct. 1977, vol. 20, No. 5, pp. 1756-1759.

IBM Technical Disclosusre Bulletin, "Mask Alignment for a Capacitative-Servo Disk," Sep. 1998, TDB-ACC-Np.: NN8809256, Vol. No. 31, Issue No. 4, p. No. 256-259, Cross References: 0018-8689-31-4-256.

IBM Technical Disclosure Bulletin, "No-edge contact wafer orientor," Jan. 1975, vol. 17, No. 8, pp. 2220-2221.

IBM Technical Disclosure Bulletin, "Vacuum-compatible low contamination wafer-orientor system," Feb. 1986, vol. 28, No. 9, pp. 4056-4058.

Keyence Corporation Brochure, "Laser thrubeam photoelectric sensors LX2 series," Date unknown.

Petersen at al., "High-performance mass-flow sensor with integrated laminar flow micro-channels," International Conference on Solid State Sensors and Actuators—Digest of Technical Papers, 1985, pp. 361-363.

Sugimoto, S. et al., "Wafer loading and unloading robot," *Sharp Technical Journal*, No. 30,(1984), pp. 79-83.

Wojcik, Zbigniew M., "A method of automatic centering of chips, masks and semiconductor wafers," Electron Technology, 1977, vol. 10, No. 3, pp. 79-96.

* cited by examiner

100
THIN FILM DEPOSITION APPARATUS AND METHOD THEREOF

CROSS-REFERENCE TO RELATED APPLICATIONS

This application claims priority to and the benefit of Korean Patent Application No. 10-2007-0130392 filed in the Korean Intellectual Property Office on Dec. 13, 2007, the entire contents of which are incorporated herein by reference.

BACKGROUND

1. Field of the Invention

The present invention relates to a deposition apparatus. More particularly, the present invention relates to a substrate mounting error detector for a deposition apparatus.

2. Description of the Related Art

In manufacturing semiconductor devices, various apparatuses and processes have been developed to provide a high quality thin film on a substrate. Several methods have been used to form a thin film, employing surface reaction of a semiconductor substrate. The methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Epitaxy (ALE). ALE was studied extensively for semiconductor deposition and electroluminescent display applications, and has been more recently referred to as Atomic Layer Deposition (ALD) for the deposition of a variety of materials.

Certain deposition apparatuses include one or more reactors housed in a chamber. The reactors may be a chemical vapor deposition reactor or an atomic layer deposition reactor. Each of the reactors can include a substrate support on which a substrate is mounted during a deposition process. If the substrate is not correctly mounted on the substrate support, an abnormal deposition may be made on the substrate, adversely affecting the quality of a deposited film on the substrate. However, because the substrate is inside the chamber, it may be difficult to determine from the outside whether the substrate has been correctly mounted on the substrate support.

The above information disclosed in this Background section is only for enhancement of understanding of the background of the invention and therefore it may contain information that does not form prior art already known in this country to a person of ordinary skill in the art.

SUMMARY

In one embodiment, a deposition apparatus includes: a chamber and a substrate support positioned in the chamber. The substrate support is configured to support a substrate. The apparatus also includes a substrate mounting error detector including: a light source configured to provide a light beam to the substrate, such that the substrate reflects the light beam; a collimator configured to selectively pass at least a portion of the light beam reflected by the substrate when the substrate is property mounted; and an optical sensor configured to detect the at least a portion of the reflected light beam passed by the collimator.

In another embodiment, a deposition apparatus includes: a substrate support configured to support a substrate; and a substrate mounting error detector. The substrate mounting error detector includes: a light source configured to generate a light beam directed to the substrate support; a collimator including one or more openings that are configured to selectively pass particularly oriented and directed portions of the light beam as reflected from the substrate or the substrate support; and an optical sensor configured to detect the portions of the light beam passed by the collimator.

In yet another embodiment, a method of depositing a thin film includes: loading a substrate onto a substrate support within a chamber; providing a light beam onto the substrate such that the light beam is reflected by the substrate; passing at least a portion of the reflected light beam when the substrate is positioned at a correct location of the substrate support while blocking the entire portion of the light beam when the substrate is positioned at an incorrect location of the substrate support; and detecting the at least a portion of the light beam.

<Description of Reference Numerals For Components in the Drawings>

| | |
|---|---|
| 10: chamber | 20: substrate support |
| 30: upper cover | 40: substrate transfer device |
| 110: light source | 120: reflecting mirror |
| 130: collimator | 140: optical sensor |

DETAILED DESCRIPTION OF EMBODIMENTS

The invention will be described more fully hereinafter with reference to the accompanying drawings, in which exemplary embodiments are shown. As those skilled in the art would realize, the described embodiments may be modified in various different ways, all without departing from the spirit or scope of the invention.

The drawings are not to scale, but rather have dimensions exaggerated for clarity. Like reference numerals designate like elements throughout the specification. It will be understood that when an element, such as a device or part, is referred to as being "on" another element, it can be directly on the other element or intervening elements may also be present. In contrast, when an element is referred to as being "directly on" another element, there are no intervening elements present.

Figure 1:
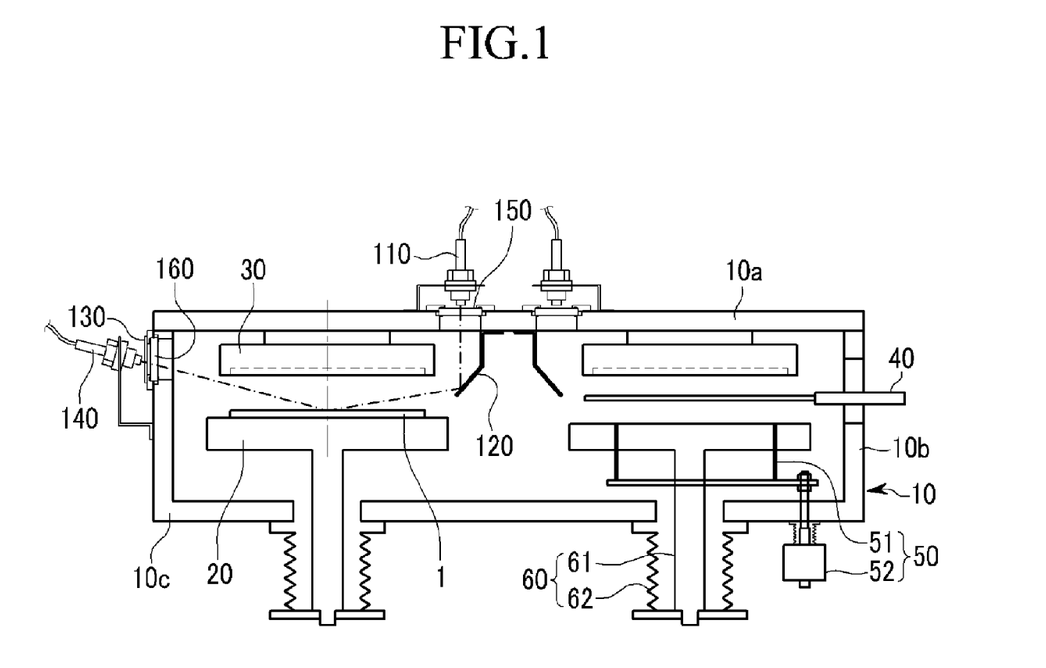
FIG. 1 is a cross-sectional view of a deposition apparatus including a substrate mounting error detector according to one embodiment.

FIG. 1 is a cross-sectional view of a deposition apparatus having a substrate mounting error detector according to one embodiment. The illustrated deposition apparatus includes a chamber 10 housing a plurality of reactors, a substrate transfer device 40, a substrate loader 50 for each reactor, a substrate support driver 60 for each reactor, a plurality of substrate mounting error detectors, first light transmission windows 150, and second light transmission windows 160.

The chamber 10 serves to house the plurality of reactors. The chamber 10 may include a top plate 10a, sidewalls 10b, and a bottom plate 10c, which together define an isolated space therein. While the chamber 10 is shown in cross-section to house two reactors in the illustrated embodiment, a skilled artisan will appreciate that the number of reactors in the chamber 10 can vary widely, depending on the design of the deposition apparatus.

The reactors may be used for atomic layer deposition (ALD) or chemical vapor deposition (CVD). Each of the reactors may include a substrate support 20 and an upper cover 30 that together define a reaction space for a deposition process.

The substrate support 20 serves to support a substrate 1 thereon during a deposition process. In the illustrated embodiment, the substrate support 20 is vertically movable between a lower position and an upper position. The upper cover 30 is positioned over the substrate support 20 while being spaced apart therefrom by a gap during loading or unloading a substrate. After a substrate is loaded on the substrate support 30 for deposition, the substrate support 20 is moved upward toward the upper cover 30. During a deposition process, the substrate support 20 may be in contact with peripheral portions of the upper cover 30 to form the reaction space. The upper cover 30 and the substrate support 20 together form a so-called clamshell reactor.

The substrate transfer device 40 serves to transfer a substrate 1 into and out of the chamber 10. The substrate transfer device 40 may include a robot arm and an end effector. In the illustrated embodiment, there is only one door for the robot arm, and the positions of the reactors may change such that one of the reactors is positioned close to the robot arm when loading a substrate onto the reactor or unloading the substrate from the reactor. In some embodiments, the substrate supports 20 of the reactors may be mounted on a rotating platform. In other embodiments, the substrate supports 20 may be configured to rotate around the center of the chamber 10, using any suitable mechanism. A skilled artisan will appreciate that various configurations of transfer devices can be adapted for use in the apparatus.

The substrate loader 50 serves to place the substrate 1 onto the substrate support 20 or lift it from the substrate support 20. When the substrate 1 is loaded into the reactor, it is transferred into the chamber 10 by the substrate transfer device 40. Then, the substrate loader 50 loads the substrate 1 onto the substrate support 20. The substrate loader 50 is installed at the substrate support 20. The substrate loader 50 may include a plurality of substrate supporting pins 51 for holding the substrate 1, and a substrate supporting pin elevating member 52 connected to the substrate supporting pins 51 to elevate them. The substrate supporting pin elevating member 52 may include an electrical motor or an air cylinder. In the illustrated embodiment, the substrate supporting pin driver 52 includes an air cylinder. In other arrangements, the pins could be stationary while movement of the support relative to the stationary pins accomplishes the loading and unloading.

The substrate support driver 60 is connected to the bottom of the substrate support 20 to vertically drive it. The substrate support driver 60 may include a shaft 61 connected to the substrate support 20, and a shaft elevating member 62 for elevating the shaft 61. The shaft elevating member 62 may include an electrical motor or an air cylinder. In the illustrated embodiment, the shaft elevating member 62 includes an air cylinder.

Each of the substrate mounting error detectors may include a light source 110, a reflecting mirror 120, a collimator 130, and an optical sensor 140. In one embodiment, each of the reactors may be provided with a substrate mounting error detector. In other embodiments, two or more of the reactors may share the same substrate mounting error detector.

The light source 110 may be positioned over the top plate 10a of the chamber 10 outside the chamber 10. The light source 110 serves to provide a light beam for detection of a substrate mounting error. The light beam may be a visible light beam or laser, The light source 110 may include a head that includes a lens. The lens serves to provide a focused light beam. The light beam travels into the chamber 10 through the first light transmission window 150 in the top plate 10a of the chamber 10. A skilled artisan will appreciate that the position of the light source can vary widely, depending on the design of the deposition apparatus.

In the illustrated embodiment, the light source 110 is oriented to provide a light beam such that the light beam travels substantially perpendicular to the first light transmission window 150. This configuration allows the light beam to pass through the first light transmission window 150 with minimal or no loss. Therefore, the light beam from the light source 110 placed outside the chamber 10 can pass through the chamber 10 with minimal or no loss, and reach the reflecting mirror 120.

The reflecting mirror 120 is positioned within the chamber 10. The reflecting mirror 120 is oriented such that it can reflect the light beam from the light source 110 toward the substrate support 20. If the mirror is partially transparent, preferably the angle of incidence is such that the reflecting mirror 120 may substantially totally reflect the light beam from the light source 110 toward the substrate 1. The reflecting mirror 120 may be installed such that it does not interfere with vertical movements of either or both of the substrate support 20 and the upper cover 30. In the illustrated embodiment, the reflecting mirror 120 is fixed to a lower surface of the top plate 10a of the chamber 10. The reflecting mirror 120 may include a plate coated with a specular material. In other embodiments, the reflecting mirror 120 can include a conventional mirror.

The collimator 130 is positioned at or outside the sidewall 10b of the chamber 10 such that it is interposed between the optical sensor 140 and the second light transmission window 160. The collimator 130 is positioned at a point on a path of the light beam that originates from the light source 110 and is reflected by the substrate 1 in the reactor. The collimator 130 blocks at least a portion of the light beam reflected by the substrate 1 such that it passes the light beam to the optical sensor 140 only when the substrate 1 is correctly or properly mounted on the substrate support 20. In the illustrated embodiment, a substrate is "correctly" or "properly" mounted if it sits in a pocket of the substrate support 20, and is flush with the support surface of the substrate support 20. In other embodiments, a substrate is "correctly" or "properly" mounted if it is flush with the support surface of a substrate support at a selected location of the substrate support. The details of the collimator 130 will be described later in detail.

The optical sensor 140 serves to sense the light beam that has passed the collimator 130. The optical sensor 140 may include any suitable light sensor for detecting a light beam reflected by the substrate 1. A sensor amplifier (not shown) may be connected to the optical sensor 140 to amplify an output signal from the optical sensor 140 to enhance the accuracy of detecting a substrate mounting error. The optical sensor 140 may include a light-receiving head that receives a light beam. In the illustrated embodiment, the term "light-receiving head" refers to an area that forms a light-sensitive surface. In one embodiment, the head may have a selected diameter of about 2 mm to about 3 mm. When the optical sensor 140 receives no light beam at the light-receiving head, it outputs no signal, indicating that a substrate mounting error has occurred.

Each of the first light transmission windows 150 may be installed at the top plate 10a of the chamber 10. The first light transmission window 150 is positioned to provide a passage through the top plate 10a such that the light beam from the light source 110 can reach the mirror 120 in the inner space of the chamber 10. The first light transmission window 150 may be formed of a substantially transparent material, such as quartz.

Each of the second light transmission windows 160 may be installed at the sidewall 10b of the chamber 10 on a path of the light beam from the substrate 1 to the optical sensor 140. The second light transmission window 160 may be formed of a transparent material, such as quartz. The light beam reflected from the substrate 1 may be refracted before reaching the optical sensor 140, depending upon the refractive index of the second light transmission window 160. Thus, the position of the optical sensor 140 may be selected to account for any refraction.

Figure 2:
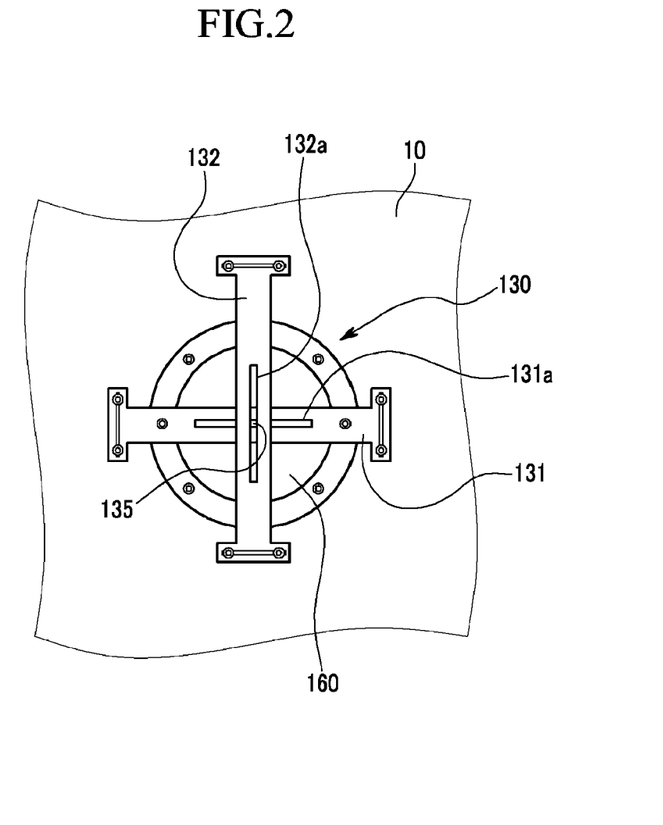
FIG. 2 is a side view of a collimator of a substrate mounting error detector in a deposition apparatus according to one embodiment.
Figure 3:
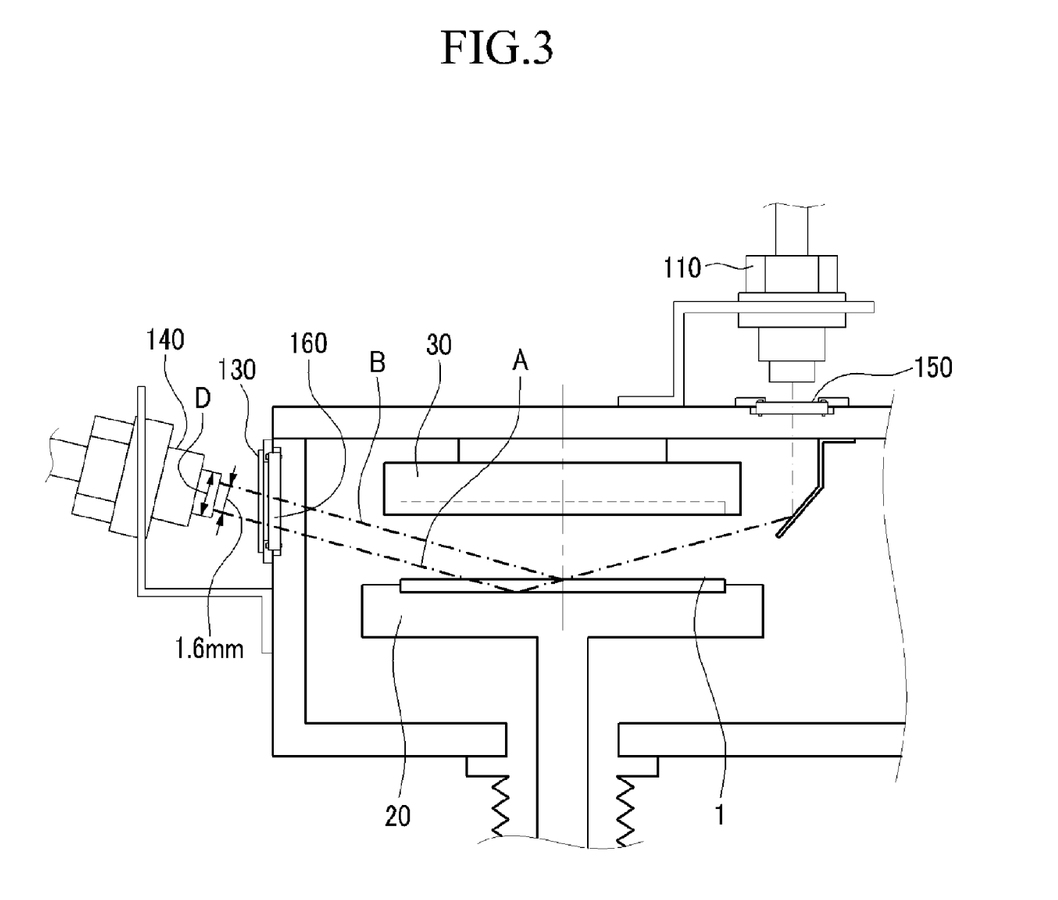
FIG. 3 illustrates paths of a light beam during the operation of the substrate mounting error detector of FIG. 1(A) when no substrate is mounted on a substrate support and (B) when a substrate is correctly mounted on the substrate support, respectively.

Referring to FIGS. 2 and 3, the configuration of the collimator 130 according to one embodiment will be described below in detail. As shown in FIG. 3, the light-receiving head of the optical sensor 140 may have a relatively large diameter D of, for example, about 2 mm to about 3 mm. Absent the collimator 130, even when the substrate 1 is not correctly mounted on the substrate support 20, the light-receiving head of the optical sensor 140 may receive the light beam reflected by the substrate 1. Thus, the optical sensor 140 may erroneously indicate that the substrate is mounted without an error.

The collimator 130 serves to prevent such an error by narrowing the light beam. The collimator 130 passes at least a portion of the reflected light beam only when the substrate is correctly mounted on the substrate support 20.

FIG. 2 is an enlarged side view of the collimator 130 installed at the sidewall 10b of the chamber 10. The illustrated collimator 130 includes a vertically moving member 131, and a horizontally moving member 132. The vertically moving member 131 includes a horizontal slit 131a for light passage. The vertically moving member 131 is vertically movable. The horizontally moving member 132 includes a vertical slit 132a for light passage. The horizontally moving member 132 is horizontally movable. In one embodiment, the horizontal slit 131a may have a length of about 10 mm to about 20 mm, and a width of about 0.9 mm to about 1.1 mm. The vertical slit 132a have a length of about 10 mm to about 20 mm, and a width of about 0.9 mm to about 1.1 mm.

The vertically moving member 131 and the horizontally moving member 132 partially overlap with each other such that the vertical slit 131a and the horizontal slit 132a cross each other. The vertical slit 131a and the horizontal slit 132a together form a square-shaped opening 135 where they overlap with each other. In one embodiment, the opening 135 may have horizontal and vertical widths, each of which may be about 0.9 mm to about 1.1 mm. The opening 135 of the collimator 130 has a dimension that is smaller than the diameter D of the light-receiving head of the optical sensor 140 and accordingly covers a smaller area than the head of the optical sensor 140. In addition, the opening 135 of the collimator 130 may allow the reflected light beam to pass therethrough only when the light beam is oriented to have a selected angle relative to the collimator 130 such that it travels in a specific direction defined by the opening of the collimator 130. In the illustrated embodiment, the position of the opening 135 may be calibrated by moving the vertically and horizontally moving members 131, 132.

When no substrate is mounted on the substrate support 20 or a substrate 1 is incorrectly mounted on the substrate support 20, the light beam reflected by the substrate support 20 or the incorrectly mounted substrate may not reach the opening 135 of the collimator. In such instances, even if the light beam reaches the opening 135, it may not be oriented to have the selected angle that would allow the light beam through the collimator 130. Thus, in such instances, the collimator 130 does not allow the light beam to reach the optical sensor 140. The light-receiving head of the optical sensor 140 does not receive the light beam, and the optical sensor 140 indicates that the substrate is not correctly mounted on the substrate support 20.

Referring to FIG. 3, the operation of the substrate mounting error detector will now be described below in detail. FIG. 3 illustrates possible paths A, B of a light beam provided by the light source 110. As shown in FIG. 3, the light path A when the substrate 1 is not mounted on the substrate support 20 is different from the light path B when the substrate 1 is correctly mounted on the substrate support 20. In the illustrated embodiment, a distance between the light paths A, B may be about 1.6 mm.

When no substrate is mounted on the substrate support 20, a light beam reflected from the substrate support 20 may not reach the optical sensor 140 because it is blocked by the collimator 130. Because the optical sensor 140 has a relatively big light-receiving head, absent the collimator 130 the reflected light beam may reach the head of the optical sensor 140, resulting in an erroneous reading of a present substrate. However, the collimator 130 blocks the entire portion of the light beam from reaching the optical sensor 140 when the substrate is absent, and the optical sensor 140 does not detect a light. Thus, the substrate mounting error detector can provide a correct result.

Figure 4:
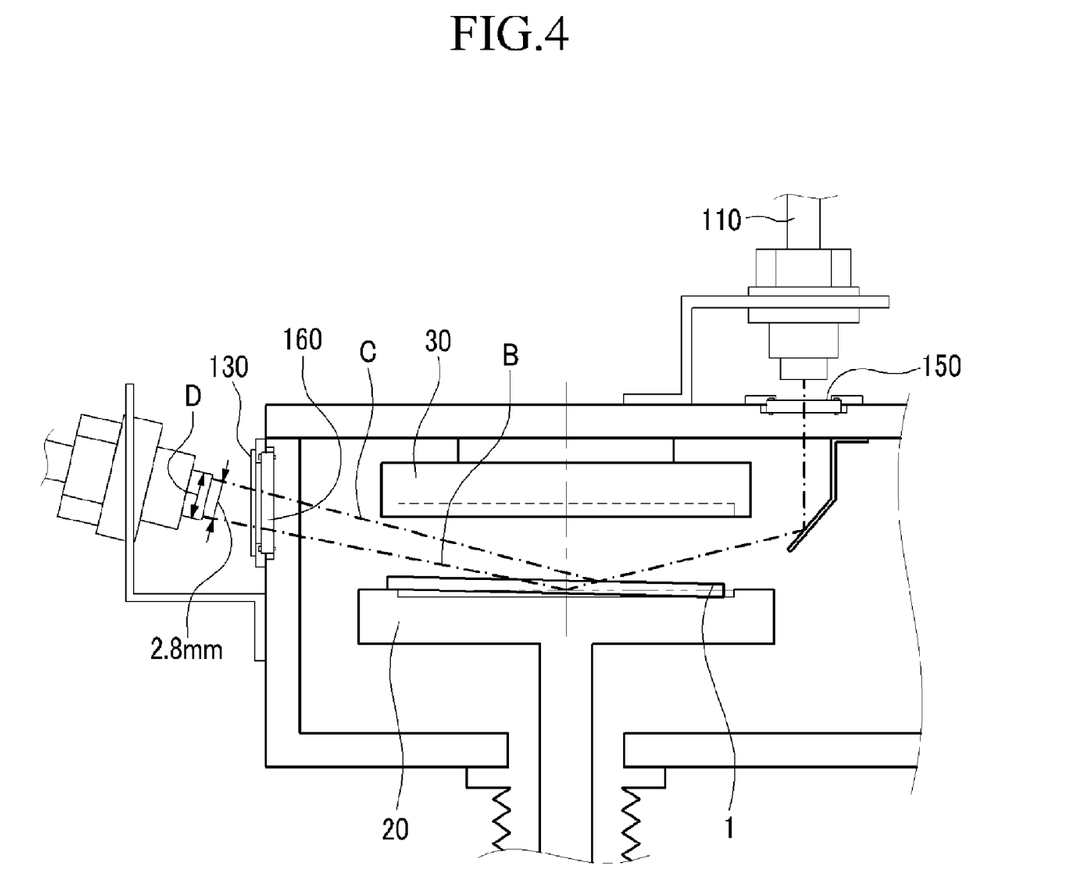
FIG. 4 illustrates paths of a light beam during the operation of the substrate mounting error detector of FIG. 1(C) when a substrate is incorrectly mounted on a substrate support and (B) when a substrate is correctly mounted on the substrate support, respectively.

FIG. 4 illustrates other possible paths of a light beam provided by the light source 110. As shown in FIG. 4, a light path B is formed when the substrate 1 is mounted at the correct position on the substrate support 20. A light path C is formed when the substrate 1 is incorrectly mounted on the substrate support 20. In the illustrated example, the incorrectly mounted substrate 1 is tilted at an angle of, for example, 0.15 degrees. For that example, a distance between the light paths B, C may be about 2.8 mm.

When a substrate is incorrectly mounted on the substrate support 20, a light beam reflected from the substrate 20 may not reach the optical sensor 140 because it is blocked by the collimator 130. However, because the optical sensor 140 has a relatively big light-receiving head, absent the collimator 130 the reflected light beam may reach the head of the optical sensor 140, resulting in an erroneous reading of proper substrate mounting. However, the collimator 130 blocks the entire portion of the light beam from reaching the optical sensor 140 when the substrate is so tilted, and the optical sensor 140 does not detect a light. Thus, the substrate mounting error detector can provide a correct result.

Figure 5:
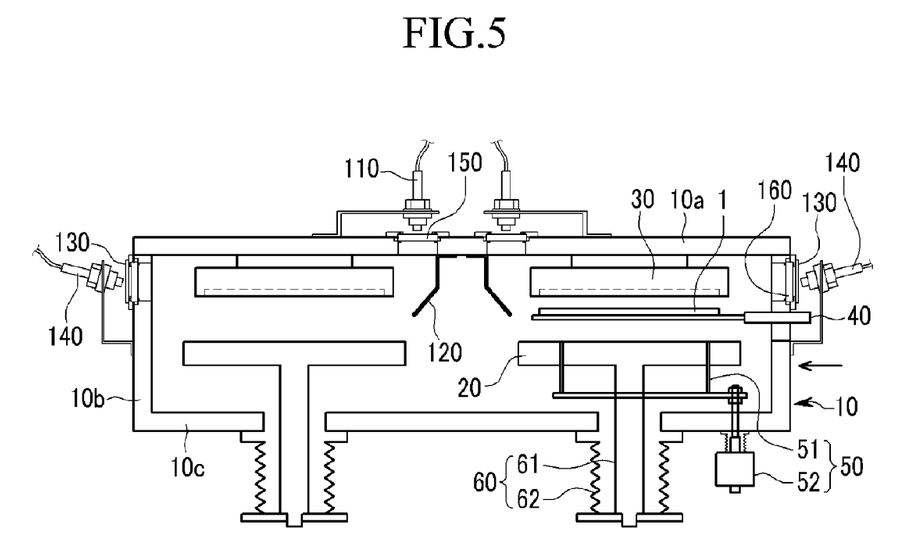
FIG. 5 to FIG. 9 are cross-sectional views of the apparatus of FIG. 1 illustrating a method of loading a substrate into a deposition apparatus according to one embodiment.

Referring to FIGS. 5 to 9, a method of loading a substrate into the deposition apparatus of FIG. 1 according to one embodiment will be described below. First, as shown in FIG. 5, a substrate 1 is transferred into the chamber 10 using the substrate transfer device 40. The substrate 1 is positioned at a first vertical level above the substrate support 20.

Figure 6:
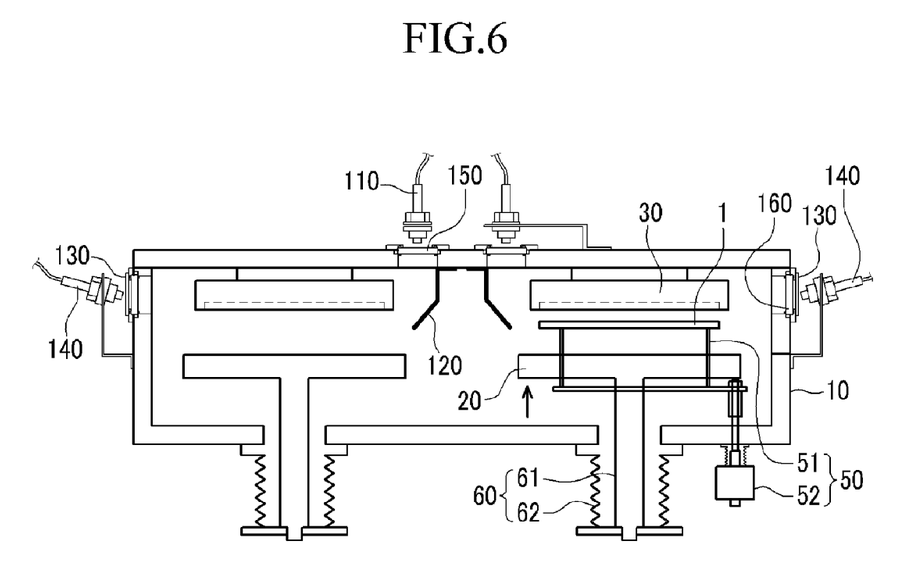
Figure 7:
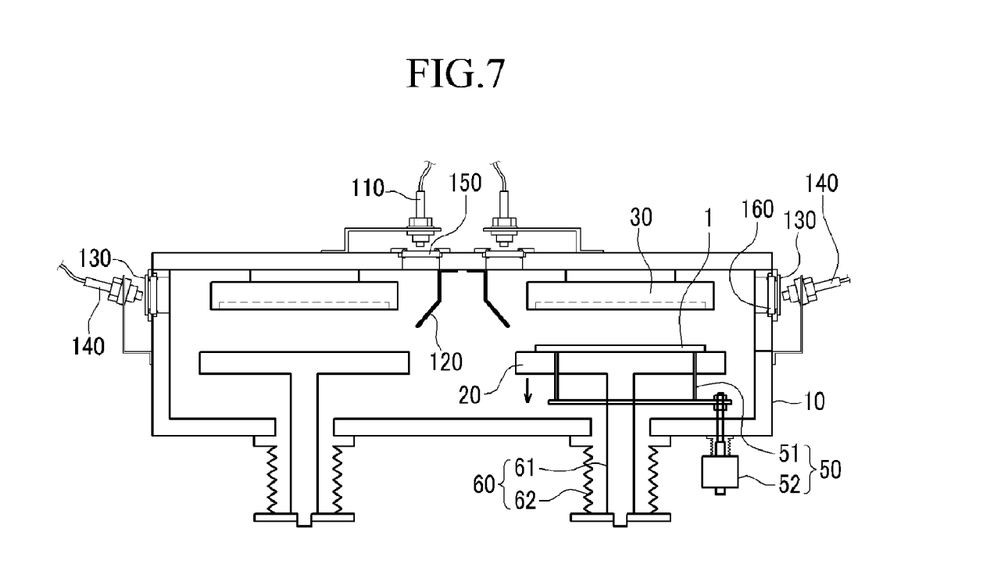

Next, as shown in FIG. 6, the substrate supporting pins 51 are moved up to hold the substrate 1 at a second vertical level above the first vertical level. The transfer device 40 is moved outside of the chamber 10 after unloading the substrate 1 from its end effector. As shown in FIG. 7, the substrate supporting pins 51 are moved down to load the substrate 1 onto the substrate support 20.

Figure 8:
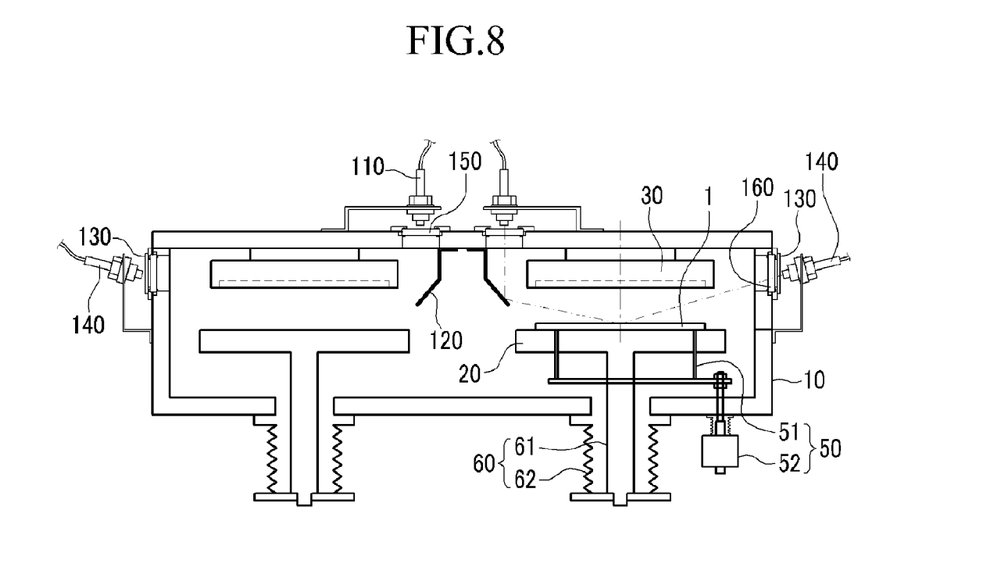

Subsequently, as shown in FIG. 8, a substrate mounting error detector (110, 120, 130, and 140) detects whether or not the substrate 1 has been correctly mounted on the support 20. The light source 110 provides a light beam to the mirror 120. The light beam is reflected by the mirror 120 and reaches the top surface of the substrate 1. The light beam is reflected by the top surface of the substrate 1, and travels toward the collimator 130. A portion of the light beam may pass the collimator 130 and reach the optical sensor 140 if the substrate is present and has been correctly mounted on the substrate support 20. In contrast, if the substrate is absent or has not been correctly mounted on the substrate support 20, the collimator 130 blocks the entire portion of the light beam, and thus the light beam does not reach the optical sensor 140. In this manner, depending on whether the optical sensor 140 detects light, the substrate mounting error detector can determine whether the substrate 1 has been correctly mounted on the substrate support 20.

Figure 9:
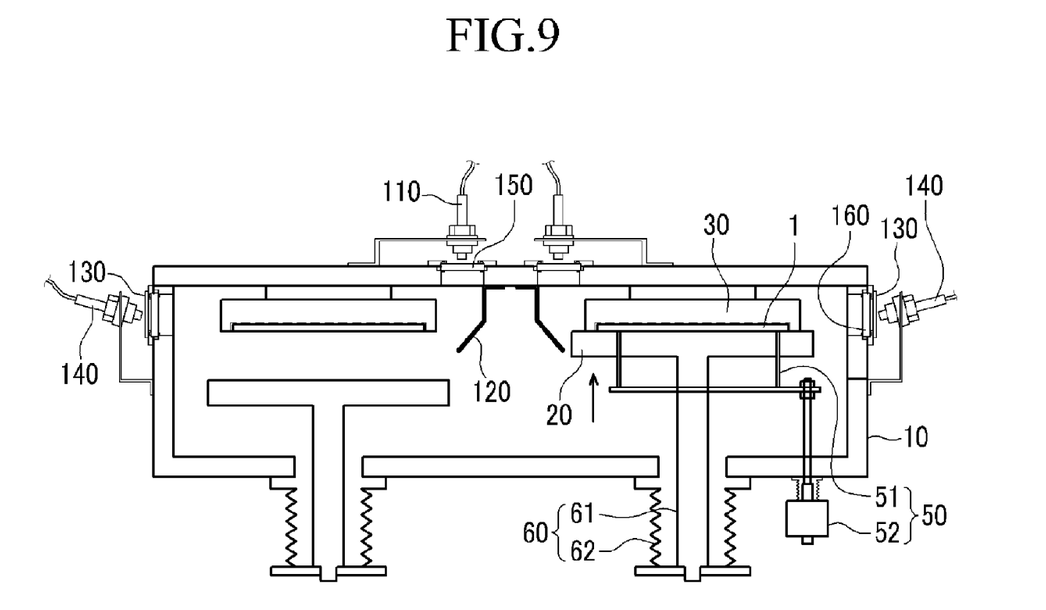

Next, as shown in FIG. 9, when it is found that the substrate 1 has been correctly mounted on the substrate support 20, the substrate support 20 is elevated such that it tightly contacts the upper cover 30 to form a reaction space for deposition. Then, a deposition process is conducted in the reaction space. If the substrate 1 has been incorrectly mounted on the substrate support 20, the substrate 1 may be returned to the outside by the substrate transfer device 40. A new substrate 1 may be transferred into the chamber 10. Alternatively, the returned substrate may be reloaded onto the substrate support 1 after adjustment of the position of the substrate 1.

In the illustrated embodiment, because the substrate support 20 and the upper cover 30 are formed of an opaque material, such as a metal, a light beam cannot pass therethrough. The detection of a substrate mounting error is performed only when the substrate support 20 is at a lower position at which the substrate support 20 is spaced apart from the upper cover 30. The substrate mounting error detector provides a light beam through a space between the substrate support 20 and the upper cover while the substrate support 20 is at the lower position, but not when the substrate support 20 is in contact with the upper cover 30.

In the embodiments described above, a deposition process is performed after it is determined whether a substrate has been correctly mounted on the support. Thus, abnormal film deposition due to a substrate mounting error can be prevented. Moreover, the proper detection of mounting errors can prevent wasted time and gases (if there was no substrate), and prevent wafer breakage (if the substrate was improperly mounted during reactor closure). Thus, it is possible to prevent the substrate and the film from being damaged due to the substrate mounting error, thereby enhancing the device reliability.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

We claim:

1. A deposition apparatus comprising:

a chamber;

a substrate support positioned in the chamber, the substrate support being configured to support a substrate; and a substrate mounting error detector comprising:

a light source configured to provide a light beam to the substrate, such that the substrate reflects the light beam;

a collimator configured to selectively pass at least a portion of the light beam reflected by the substrate when the substrate is properly mounted; and an optical sensor configured to detect the at least a portion of the reflected light beam passed by the collimator, wherein the collimator comprises a vertically moving member including a horizontal slit, and a horizontally moving member including a vertical slit partially overlapping with the horizontal slit, and wherein the horizontal slit and the vertical slit cross each other to together define an opening that selectively pass the at least a portion of the reflected light beam when the substrate is properly mounted.

2. The apparatus of claim 1, wherein the optical sensor includes a light-receiving head including a light-sensitive area, and wherein the opening covers a smaller area than the light-sensitive area of the light-receiving head.

3. The apparatus of claim 2, wherein the opening is aligned with the light-receiving head such that the at least a portion of the reflected light beam reaches the light-receiving head through the opening.

4. The apparatus of claim 3, wherein the opening has an area having a horizontal width and a vertical width, at least one of the horizontal and vertical widths being from about 0.9 mm to about 1.1 mm.

5. The apparatus of claim 4, wherein the optical sensor comprises a light-receiving head having a diameter of about 2 mm to about 3 mm.

6. The apparatus of claim 1, wherein the optical sensor is positioned outside the chamber, and wherein the apparatus further comprises a light transmission window in one of the sidewalls between the substrate support and the optical sensor.

7. The apparatus of claim 1, wherein the optical sensor is positioned at or adjacent to one of the sidewalls, and wherein the collimator is interposed between the optical sensor and the substrate support.

8. The apparatus of claim 1, further comprising an upper cover configured to define a reaction space together with the substrate support, wherein the substrate support is vertically movable between a lower position and an upper position, and wherein the light source is configured to provide the light beam through a space between the upper cover and the substrate support, when the substrate support is at the lower position.

9. The apparatus of claim 1, further comprising a mirror in the chamber, wherein the mirror is oriented to reflect the light beam from the light source toward the substrate.

10. The apparatus of claim 9, wherein the optical sensor includes a light-receiving head including a light-sensitive area, and wherein the opening covers a smaller area than the light-sensitive area of the light-receiving head.

11. The apparatus of claim 10, wherein the opening is aligned with the light-receiving head such that the at least a portion of the reflected light beam reaches the light-receiving head through the opening.

12. The apparatus of claim 11, wherein the opening has an area having a horizontal width and a vertical width, at least one of the horizontal and vertical widths being from about 0.9 mm to about 1.1 mm.

13. The apparatus of claim 12, wherein the optical sensor comprises a light-receiving head having a diameter of about 2 mm to about 3 mm.

14. The apparatus of claim 9, wherein the optical sensor is positioned outside the chamber, and wherein the apparatus further comprises a light transmission window in one of the sidewalls between the substrate support and the optical sensor.

15. The apparatus of claim 9, wherein the optical sensor is positioned at or adjacent to one of the sidewalls, and wherein the collimator is interposed between the optical sensor and the substrate support.

16. The apparatus of claim 9, further comprising an upper cover configured to define a reaction space together with the substrate support, wherein the substrate support is vertically movable between a lower position and an upper position, and wherein the light source is configured to provide the light beam through a space between the upper cover and the substrate support when the substrate support is at the lower position.

* * * * *